(12) United States Patent
Stephan

(10) Patent No.: US 9,158,023 B2
(45) Date of Patent: Oct. 13, 2015

(54) METHOD AND APPARATUS FOR TARGET-GUIDED LOCALIZING OF A CABLE FAULT

(71) Applicant: Hagenuk KMT Kabelmesstechnik GmbH, Radeburg (DE)

(72) Inventor: Marco Stephan, Dresden (DE)

(73) Assignee: Hagenuk KMT Kabelmesstechnik GmbH, Radeburg (DE)

( * ) Notice: Subject to any disclaimer, the term of this patent is extended or adjusted under 35 U.S.C. 154(b) by 204 days.

(21) Appl. No.: 13/908,143

(22) Filed: Jun. 3, 2013

(65) Prior Publication Data

US 2013/0320983 A1    Dec. 5, 2013

(30) Foreign Application Priority Data

Jun. 1, 2012   (DE) .......................... 10 2012 011 066

(51) Int. Cl.
*G01V 3/08* (2006.01)
*G01V 3/10* (2006.01)
(Continued)

(52) U.S. Cl.
CPC ................ *G01V 3/10* (2013.01); *G01R 31/083* (2013.01); *G01V 3/104* (2013.01)

(58) Field of Classification Search
CPC ......... G01V 3/10; G01V 3/104; G01R 31/083
USPC ................... 324/536–544, 67, 323, 326, 376; 73/40.5, 587, 584, 592
See application file for complete search history.

(56) References Cited

U.S. PATENT DOCUMENTS

| | | | |
|---|---|---|---|
| 4,565,964 A | | 1/1986 | Matthews et al. |
| 4,835,478 A | * | 5/1989 | Haddon et al. ................. 324/536 |

(Continued)

FOREIGN PATENT DOCUMENTS

| | | |
|---|---|---|
| DE | 1 231 808 | 1/1967 |
| DE | 1 791 027 | 10/1971 |

(Continued)

OTHER PUBLICATIONS

Megger, "MPP1000 Pinpointer", MPP1000_DS_en_V02, www.megger.com, accessed at http://web.archive.org/web/20110315000000*/http://www.techrentals.com.au/uploads/MEG_MPP1002-FAULT_PP.pdf, dated Mar. 5, 2011, pp. 1-2.

(Continued)

*Primary Examiner* — Huy Q Phan
*Assistant Examiner* — Raul Rios Russo
(74) *Attorney, Agent, or Firm* — W. F. Fasse

(57) ABSTRACT

A method and an apparatus provide targeted guidance for a user to locate and trace-out the path of a buried electrical cable, and to locate a cable fault along the cable. A current pulse is applied to the cable, whereby a magnetic field is generated around the cable and an acoustic signal is emitted from the cable fault. The apparatus detects and measures magnetic field information to locate the cable. The apparatus measures a time delay between detecting the magnetic signal and detecting the acoustic signal. By comparing successive time delays at successive measuring positions, a relative proximity to the cable fault is determined. The cable location information and the cable fault distance information are combined to produce a direction indication for the user. Tracing the cable layout and determining the cable fault location can be carried out in a single procedure using a single apparatus.

19 Claims, 3 Drawing Sheets

(51) Int. Cl.
*G01R 31/08* (2006.01)
*G01R 31/12* (2006.01)
*H01H 9/50* (2006.01)

(56) References Cited

U.S. PATENT DOCUMENTS

| | | | |
|---|---|---|---|
| 4,851,782 | A | 7/1989 | Jeerings et al. |
| 4,871,883 | A * | 10/1989 | Guiol ............................ 174/36 |
| 5,210,498 | A | 5/1993 | Paananen |
| 5,352,984 | A | 10/1994 | Piesinger |
| 5,428,295 | A | 6/1995 | Beeman |
| 6,003,376 | A * | 12/1999 | Burns et al. .................... 73/584 |
| 6,668,668 | B1 * | 12/2003 | Peshkin ..................... 73/862.56 |
| 7,443,172 | B2 | 10/2008 | Fraedrich |
| 8,264,226 | B1 | 9/2012 | Olsson et al. |
| 8,474,320 | B2 | 7/2013 | Kordon et al. |
| 8,810,254 | B2 | 8/2014 | Kuettner et al. |
| 2010/0001713 | A1 | 1/2010 | Royle |
| 2010/0007354 | A1 | 1/2010 | Deaver, Sr. et al. |
| 2012/0006117 | A1 * | 1/2012 | Kordon et al. .................. 73/587 |
| 2012/0105073 | A1 * | 5/2012 | Kuettner et al. .............. 324/536 |
| 2013/0204555 | A1 * | 8/2013 | Scheuschner et al. ........ 702/59 |

FOREIGN PATENT DOCUMENTS

| | | |
|---|---|---|
| DE | 2 138 108 | 4/1972 |
| DE | 267 336 | 4/1989 |
| DE | 102010013613 | 12/2011 |
| DE | 102010050375 | 5/2012 |
| EP | 1 387 175 | 2/2004 |
| EP | 2 405 279 | 1/2012 |
| EP | 2 450 716 | 5/2012 |
| JP | 56-108986 A | 8/1981 |

OTHER PUBLICATIONS

European Examiner Hermann Koll, European Search Report for European Patent Application No. EP 13 00 2656, dated Oct. 7, 2013, 3 pages, Berlin, Germany, with English translation, 3 pages.

* cited by examiner

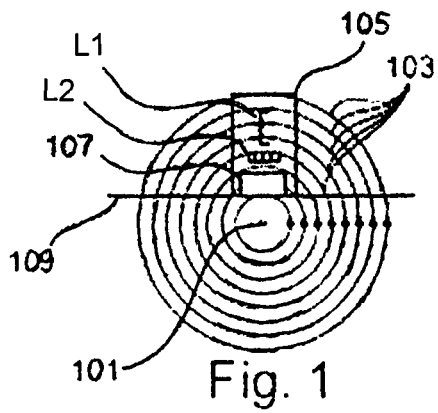
Fig. 1
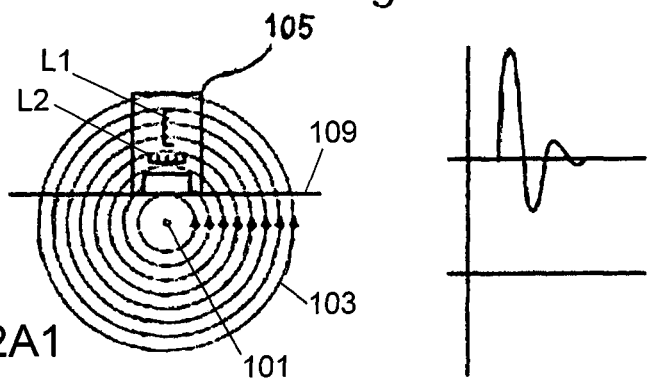
FIG. 2A1
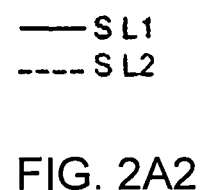
FIG. 2A2
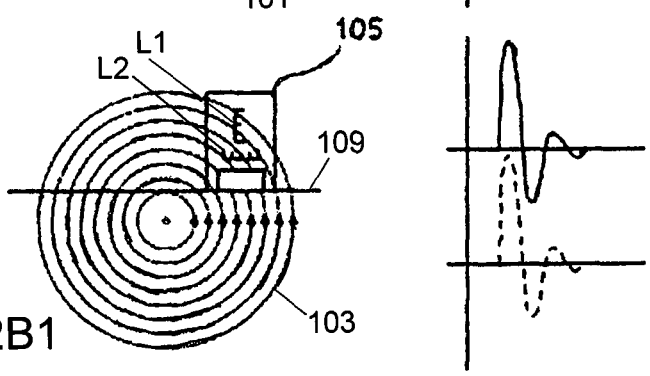
FIG. 2B1
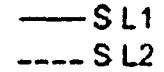
FIG. 2B2
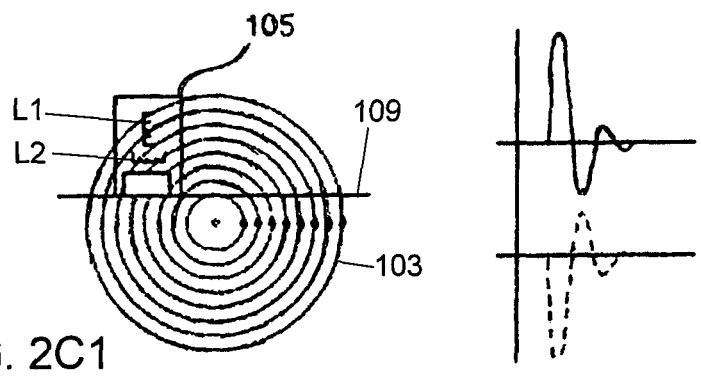
FIG. 2C1
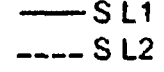
FIG. 2C2

METHOD AND APPARATUS FOR TARGET-GUIDED LOCALIZING OF A CABLE FAULT

PRIORITY CLAIM

This application is based on and claims the priority under 35 USC 119 of German Patent Application 10 2012 011 066.9, filed on Jun. 1, 2012, the entire disclosure of which is incorporated herein by reference.

FIELD OF THE INVENTION

The invention relates to a method as well as an apparatus for finding or determining the location of a cable fault in a buried cable in a targeted or target-guided manner.

BACKGROUND INFORMATION

In the field of locating a cable fault in an underground or other buried cable, it is known to locate the fault using a ground microphone, whereby the user has no initial information about the position of the sensor over the cable or conductor line and no information about the position of the fault. In order to find the location of the fault, the user of the device gradually approaches closer to the fault by making successive measurements, in a "trial and error" process, namely in that the user successively moves the ground microphone to successive measurement positions, and then determines and compares successive coincidence measurement values at the successive measurement positions. The coincidence measurement value represents the time difference between the arrival of the magnetic field pulse that is generated around the cable by an electrical pulse fed into the cable, and the acoustic pulse that is generated by a sparking arc or flash-over or the like at the cable fault due to the electrical pulse in the cable. If the coincidence measurement values become smaller from one measuring position to the next, then the user knows that he is getting closer to the cable fault. On the other hand, if the coincidence measurement values become larger, then the user knows that he is moving farther away from the cable fault.

In the above known process using the known equipment, it is problematic that the user has no information about the actual position and layout of the cable itself. Thus, the user might move transversely to the cable line from one measuring position to the next, or inadvertently move away from the path or layout of the cable, for example especially where the cable makes a curve. In such a case, the user thus obtains larger difference measured values, which suggest to him, that he is moving farther away from the cable fault location. However, these measurements and the resulting measured values are faulty, because of the progressive motion to successive measuring positions relative to the unknown position and layout of the cable.

To avoid the above problem, it is known to trace out the position and layout of the cable in a previous process by means of an acoustic frequency transmitting and receiving system. Thereby, the user first determines the position and layout of the underground or other buried cable, and records or marks the cable position and layout for later reference when subsequently carrying out the separate cable fault locating process as described above.

Thus, for locating the cable fault, it is generally necessary to carry out two successive time-consuming measuring processes one after the other, namely first locating and tracing out the location and the layout of the cable itself, and thereafter performing the actual cable fault locating process. This is time consuming and requires two distinct sets of equipment, and therefore becomes expensive and cumbersome.

SUMMARY OF THE INVENTION

It is an object of one or more embodiments of the invention to enable the simultaneous tracing-out of a buried cable and locating of a cable fault location in the cable, in a single combined process using a single combined apparatus or equipment. Another object of one or more embodiments of the invention is to provide directional indications to the user of the apparatus, so as to give the user targeted guidance for localizing or "homing in" on the cable fault location in a targeted, efficient manner, with minimized erroneous or faulty measurements and minimized "hunting" for the cable fault location in incorrect directions or incorrect locations. One or more embodiments of the invention further aim to avoid or overcome the disadvantages of the prior art, and to achieve additional advantages, as apparent from the present specification. The attainment of these objects is, however, not a required limitation of the claimed embodiments of the invention.

The above objects have been achieved in a method that proceeds with the following steps. A current pulse is applied to, induced in or imposed on the buried cable, so that a magnetic field is induced around the cable. At least one magnetic field information or data regarding the magnetic field induced by the current pulse is externally determined, whereby this information may relate to or be a subset or entire set of orthogonally measured magnetic field signals. This magnetic field information is used to determine a position or direction of the cable relative to the test apparatus. Coincidence measured values (namely the respective time difference between the arrival of the magnetic field pulse and the arrival of the acoustic signal pulse) are determined, and a directional indication regarding the position or direction of the cable fault is determined by comparing the coincidence measured values. In a further embodiment, the information regarding the position or direction of the cable and the information regarding the position or direction of the cable fault are combined to form a combined direction information. Namely, the evaluation and combination of the two types of information can provide an indication of the position of the cable relative to the present measuring position, i.e. the present location of the test apparatus, as well as an indication of the direction to the cable fault from the present measuring position. Thus it can be determined whether the present measuring position is located directly above the buried cable, or in which direction the buried cable is located relative to the present measuring position, and it can also be determined in what direction the cable fault is located along the buried cable relative to the present measuring position.

Furthermore, an embodiment of the invention also provides an alternative measuring method for tracing-out the position and layout of the cable, without using the acoustic signal in the conventional manner. Namely, as mentioned above, an embodiment of the invention provides a left/right detection of the location of the cable relative to the present measuring position, and the position and layout of the cable line are thus traceable by means of successive indications of this left/right detection at successive measuring positions, even without coupling-in an acoustic signal (for example very far away from a cable fault location).

In order to ensure a proper understanding of terminology used in this application, the following definitions and explanations shall be taken into account.

The term "tracing" or "tracing out" a buried cable refers to any and all methods of locating a cable that is not visible. Moreover, these terms do not require determining the entire path or layout of a cable line, but rather also encompass the locating of a single cable position along a cable, as well as determining the layout of any portion of a cable.

A "cable position" refers to any vertical or horizontal position or location above or laterally next to a cable, so that when digging/excavating the ground or opening other covering material under or behind which the cable is hidden, it will usually be expected that the cable will be reached or exposed. Particularly, the term "cable position" encompasses the shortest spacing distance between the measuring location and the cable. However, the "cable position" does not need to be the exact is position of the cable, but rather this term also allows small deviations or tolerances, because measurement errors generate a certain error distribution and deviation about the exact location. Particularly, the error is dependent on the burial depth of the cable. In the context of the present application, such errors extend from essentially zero, or several decimeters to several meters. Thus the "cable position" allows for such a range of deviation or tolerance from the actual exact position of the cable.

A "fault direction" refers to an information regarding the direction in which the fault locating apparatus should be moved from one measuring position to the next measuring position in order to reduce the spacing distance to the fault location in the cable. Namely, this term does not require an exactly accurate indication of the actual exact direction from one measuring position to the cable fault location, but rather may involve at least an indication of a direction in which the distance to the fault location will be reduced.

The term "cable" refers to all single-conductor and multi-conductor electric-current-carrying cables. This term especially includes middle voltage cables as well as high voltage cables.

A "buried" cable includes not only cables that are buried under the ground, but also all other cables that are not directly accessible or not directly visible, such as electrical power cables hidden or "buried" in the wall of a house.

A "current pulse" refers to an electrical signal or electrical variation having relatively steep detectable signal flanks in an electric current. Particularly, these relatively steep signal flanks of a "current pulse" influence the phase position of the detectable magnetic field that is generated around the cable. Such a current pulse may be generated and applied to or imposed on the cable by means of a surge voltage generator. The term "current pulse" also encompasses a voltage pulse, because a voltage pulse will correspondingly cause a current pulse due to the cable resistance. The time duration or dwell time of the cable pulse (e.g. current pulse or voltage pulse in the cable) can encompass several microseconds. Furthermore, the cable pulse may comprise various different current pulse signal forms or pulse wave forms.

The "external" determination of the magnetic field information is especially carried out above the ground, or outside of any covering medium under which the cable is "buried". An external determination always exists whenever no destructive procedures are necessary for accessing the cable, or carrying out a measurement or determination, for example when it is not necessary to excavate the ground above the cable or it is not necessary to cut or break open a wall in which the cable is hidden.

The term "magnetic field informations" refers to magnetic B-field strengths, phase positions, directions and progressions over space and/or time. "Orthogonal magnetic field informations" refer to all informations that can be determined by means of magnetic field sensors that are oriented or offset orthogonally relative to one another, but also refers to all informations that can be mathematically calculated and thus determined from at least two sensors that are not oriented orthogonally relative to one another, but rather at some other angle such as 45° for example. Namely, the orthogonal magnetic field informations can also be mathematically determined from any such two sensors oriented at angles other than orthogonally relative to one another.

To provide a simple embodiment for determining the cable direction or cable position relative to the cable evaluating apparatus or fault locating apparatus, the magnetic field information especially comprises a phase position of a magnetic field as determined from the magnetic field measurement.

In a further embodiment, an inventive method additionally comprises a step of leveling the evaluating or fault locating apparatus, whereby the external determining of the orthogonal magnetic field information is carried out internally within the apparatus, which is also referred to as a measuring apparatus. Thereby an optimized method is provided, because any tilting of the apparatus during the measurement is prevented, and thereby errors while tracing-out the layout of the cable can be minimized.

A "leveling" especially refers to orienting the measuring apparatus correctly on a horizontal plane. In a simple manner, this can be achieved in that the evaluating or measuring apparatus has a flat horizontal bottom surface, which is simply set down onto the horizontal ground in order to carry out the measurement. Alternatively, an active leveling can be carried out using one or more bubble levels and/or electronic leveling instruments. Thereby a true accurate leveling of the evaluating or measuring apparatus can be ensured, which in turn assures a known horizontal orientation of the apparatus and a corresponding known orientation of the apparatus's electromagnetic coils, relative to the magnetic field that is to be measures.

In the above manners, a simple structural embodiment for the determination of the magnetic field information is provided.

In addition to the steps for tracing out the position or layout of the cable, an embodiment of a method according to the invention for determining the direction of the cable fault location comprises the following steps:

applying a current or voltage pulse to the cable to cause an electrical arc-over or flash-over at the cable fault, which generates an acoustic signal, and determining or measuring the acoustic signal at a first measuring position;

determining a first time difference between the detection of the magnetic field information and the detection of the acoustic signal at the first measuring position;

changing the measuring position from the first measuring position to a different second measuring position;

applying a current or voltage pulse to the cable to cause a cable fault arc-over or flash-over, which generates an acoustic signal, and then measuring or determining the acoustic signal at the second measuring position;

determining a second time difference between the detection of the magnetic field information and the detection of the acoustic signal at the second measuring position; and determining a fault direction by comparing the first time difference with the second time difference, and with reference to the changed position of the apparatus between the two measurements.

Thereby a method is provided for quickly locating an arc-over or flash-over fault in an electrical cable line, which is produced through the use of a surge voltage generator for example, without requiring the previous use of an audio frequency transmitter and receiver for tracing out the layout of the cable. Hereby, in an advantageous manner, the user can obtain both an information regarding the position of the apparatus over or relative to the cable, as well as a direction indication toward the cable fault location. The user of such an apparatus according to an embodiment of the invention can thus more-quickly find or locate a cable fault location.

In a particular embodiment, the informations regarding the position of the apparatus relative to the cable (or vice versa) and the motion direction toward the cable fault are combined and indicated as a directional arrow on a display or other output device of the apparatus. Thereby, the display indicates to the user, in which direction the cable line or especially the cable fault location is located.

Thereby, locating the position or tracing out the layout of the cable, and locating the cable fault location do not need to be carried out in two separate procedures successively one after another, but rather can be carried out simultaneously. This achieves an enormous time savings.

A "localizing or locating of a cable fault" refers to further limiting or "homing in on" the location of the cable fault. This does not require exactly determining the precise location of the cable fault, but rather determining the area of the cable fault within the required degree of precision, or successively improving or limiting the location of the cable fault. Especially because the position and/or layout of the cable are known due to the cable tracing features, therefore the location of the cable fault can be well determined externally, e.g. above the ground.

The term "cable fault" refers to any and all occurrences, characteristics, variations and/or deviations in the cable, at which the application of a current pulse or voltage pulse will induce a current flash-over, arc or breakdown, which produces an acoustic (flash-over) signal. Such an acoustic (flash-over) signal is generally designated as an "acoustic signal". Among other things, representative examples of a "cable fault" include a broken conductor line, a partially broken conductor line, or damaged insulation of the cable.

The "measuring position" is especially the location at which a measurement is carried out. In such a measurement, both the cable position and/or cable direction as well as the transit time of the acoustic signal or correspondingly the time difference between the magnetic field information and the acoustic signal can be determined.

The "acoustic signal" is especially a signal that is produced or generated by a voltage flash-over as described above, and that is measured by means of a microphone or any other acoustic sensor.

In a further particular embodiment, measurements are carried out at plural successive measuring positions to determine respectively a time difference between the respective magnetic field information and the respective acoustic signal, and thereby especially to determine the respective cable fault direction.

Thereby, a user of the apparatus can gradually approach closer to the fault location by successive measuring steps at successive measuring positions.

In order to obtain a reliable information regarding the fault location, a minimum of the time difference can be determined. This can be achieved in that the time difference takes on larger or greater values with increasing spacing distance from the fault location.

In a further embodiment, the determination of the respective time difference is carried out vertically above the buried cable. This can be advantageous especially through the knowledge of the cable position and/or layout due to the cable tracing procedure.

In order to detect a position change in a technically measured manner, the change from the first measuring position to the second measuring position may especially be determined or sensed by means of a motion sensor.

In a further aspect or embodiment of the invention, the above objects are achieved in a fault locating or localizing apparatus, also referred to as an evaluating apparatus or a measuring apparatus, which is constructed, embodied and adapted to carry out a method as disclosed herein for localizing a cable fault of a buried cable. The fault localizing apparatus especially includes device components for tracing the position and/or layout of the cable as well as elements for determining the direction toward the cable fault.

BRIEF DESCRIPTION OF THE DRAWINGS

In order that the invention may be clearly understood, it will now be explained in further detail in connection with example embodiments thereof, with reference to the accompanying drawings wherein:

FIG. 1 is a schematic illustration of a vertical section through the ground with a buried cable therein generating a magnetic field, and a fault localizing apparatus according to the invention measuring the magnetic field;

FIGS. 2A1, 2B1 and 2C1 are respective vertical sectional illustrations similar to FIG. 1, but respectively showing three different measuring positions of the apparatus relative to the cable;

FIGS. 2A2, 2B2 and 2C2 are respective schematic signal diagrams showing representative signals of two orthogonal coils of the fault localizing apparatus detecting the magnetic field in the measuring positions as shown respectively in FIGS. 2A1, 2B1 and 2C1;

DETAILED DESCRIPTION OF PREFERRED EXAMPLE EMBODIMENTS AND OF THE BEST MODE OF THE INVENTION

In the example embodiment illustrated in FIG. 1, a middle voltage cable 101 is laid out and buried under or in the ground 109. When an electrical current flows in the cable 101, this generates a magnetic field around the cable as indicated by the magnetic field lines 103. In order to locate or localize, i.e. determine the location of and/or trace out the path or layout of, the cable 101, a cable fault localizing apparatus 105 is placed on the surface of the ground 109 at a measuring position that is at least sufficiently close to the cable 101 so as to detect the magnetic field e.g. magnetic field lines 103. The cable fault localizing apparatus 105 includes a ground-borne sound pick-up or acoustic sensor 107, e.g. a microphone, as well as a cable tracing apparatus including two orthogonally arranged coils L1 and L2.

Figure 4:
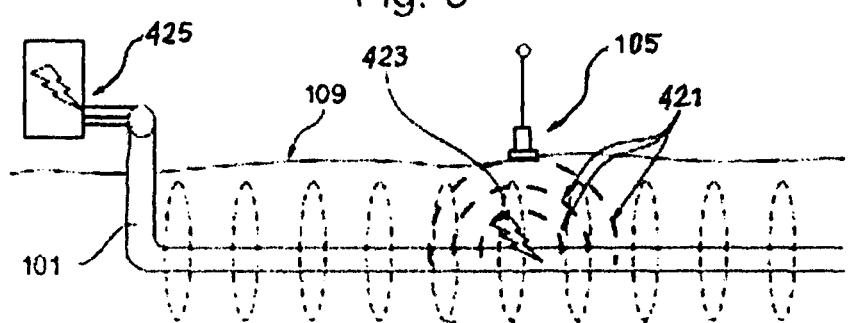
FIG. 4 is a schematic illustration of an arrangement of the fault localizing apparatus for detecting and locating a fault in a buried cable, essentially presenting a side view of the arrangement of FIG. 1.

The apparatus 105 is used for locating the cable 101 as depicted in the sub-figures of FIG. 2. FIG. 2A1 shows the situation in which the cable fault localizing apparatus 105 is positioned directly above the middle voltage cable 101. On the other hand, FIGS. 2B1 and 2C1 respectively illustrate the situations in which the apparatus 105 is offset to the right or offset to the left of the cable 101 on the surface of the ground 109. A current pulse is applied to or imposed on the cable 101 by an electrical surge generator 425, e.g. a voltage surge generator, as illustrated in FIG. 4. The resulting current flow in the cable 101 generates a magnetic field 103, which is detected and measured by the orthogonal coils L1 and L2. As a result, the coils L1 and L2 respectively generate the signals SL1 and SL2 as shown in FIGS. 2A2, 2B2 and 2C2 respectively corresponding to the measuring positions illustrated in FIGS. 2A1, 2B1 and 2C1. Namely, if the cable fault localizing apparatus 105 is positioned at a measuring position directly vertically above the cable 101 as shown in FIG. 2A1, then the first coil L1 is excited by the magnetic field 103 and produces the signal SL1 as shown in FIG. 2A2, while the second coil L2 is not excited by the magnetic field 103 and thus generates no signal SL2 as shown in FIG. 2A2. From this pattern or characteristic of the signals SL1 and SL2, it can be concluded that the apparatus 105 is directly above the cable 101.

Next, in the situation as shown in FIG. 2B1, the apparatus 105 is at a measuring position offset to the right of the cable 101. In this situation, both coils L1 and L2 intercept the magnetic field 103 and thus both coils are energized and output respective signals SL1 and SL2. As an example depending on the particular orientation and circuit connection of the two coils L1 and L2, both coils L1 and L2 intercept the magnetic field 103 in the same relative magnetic flux direction (counterclockwise in the figures) with respect to the orientation of the coils. Thus, the coils L1 and L2 respectively generate signals SL1 and SL2 that are in phase with one another as shown in FIG. 2B2.

On the other hand, when the apparatus 105 is at a measuring position offset to the left of the cable 101 as shown in FIG. 2C1, then the first coil L1 will still be intercepted by the magnetic field 103 in the same flux direction (passing to the left through the coil as shown) and thus produce a signal SL1 in FIG. 2C2 that has similar phase as the signal in FIG. 2B2. The second coil L2, however, in the position in FIG. 2C1 is now intercepted by the magnetic field 103 in the opposite direction (passing downwardly through the coil) compared to the situation in FIG. 2B1 (passing upwardly through the coil), so that the signal SL2 as shown in FIG. 2C2 has the opposite phase compared to the signal SL2 in FIG. 2B2, and thus also the opposite phase compared to the signal SL1 as shown in FIG. 2C2.

The resulting signal patterns or characteristics as shown in FIGS. 2A2, 2B2 and 2C2 allow a conclusion to be reached as to the position of the apparatus 105 relative to the cable 101, based on the known orientation of the coils and the known current flow direction in the cable. Namely, the signal characteristic in FIG. 2A2 shows that the apparatus 105 is directly above the cable 101 as shown in FIG. 2A1, the signal characteristic shown in FIG. 2B2 indicates that the apparatus 105 is offset to the right of the cable 101 as shown in FIG. 2B1, and the signal characteristic shown in FIG. 2C2 indicates that the apparatus 105 is offset to the left of the cable 101 as shown in FIG. 2C1. The determination of left/right position is made based on the phase position of the signal SL2 relative to the signal SL1 as described above. Furthermore, the relative distance from the apparatus to the cable can be determined based on the relative signal amplitude or strength. Namely, as explained above, when the apparatus is directly above the cable as shown in FIG. 2A1, then the signal SL2 has minimum or zero amplitude while the signal SL1 has maximum amplitude. As the apparatus is moved farther away from the cable (to the left or the right), the amplitude of the signal SL1 will diminish, while the amplitude of the signal SL2 will initially increase and then diminish at greater distance. By comparing the signal amplitudes at successive measuring locations, it can be determined if the apparatus is being moved closer to or farther away from the cable.

Thus, by successively moving the apparatus 105 to successive different measuring positions on the ground surface 109, the resulting directional indications provided by the apparatus 105 enable the user to find the position of, and trace out the layout of, the cable 101. Thereby, not only the location but also the layout or path of the underground cable is determined by a simple aboveground measurement and evaluation using the apparatus 105.

Figure 3:
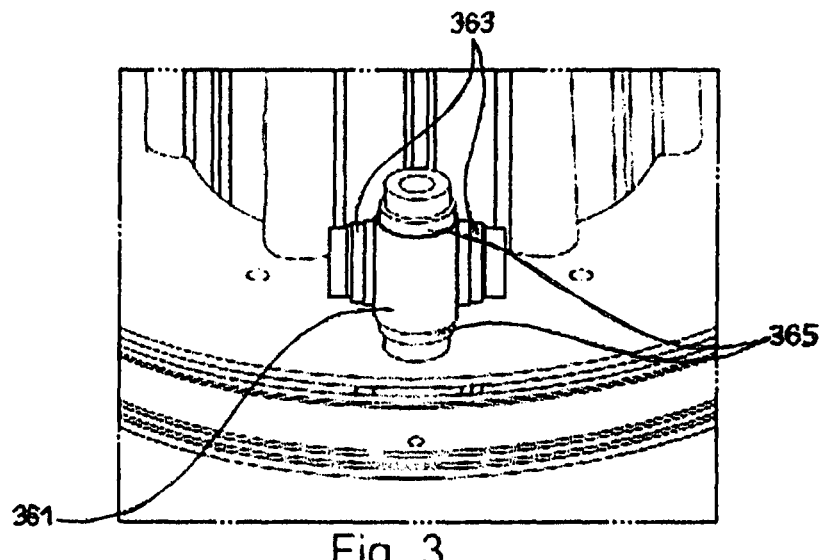
FIG. 3 is a schematic perspective view of the spatial arrangement of orthogonal coils on the fault localizing apparatus.

The actual arrangement of the coils L1 and L2 on the apparatus 105 can be seen in the schematic perspective view of FIG. 3. The coil or coils L1 as shown with reference number 363, and the coil or coils L2 as shown with reference number 365, are rigidly and securely connected with the fault localizing apparatus 105 via a mount 361, which holds the coils oriented orthogonally relative to one another. As mentioned above, it is not crucially necessary that the coils are orthogonally oriented, but rather only that the coils are oriented with their axes diverging from one another, and then through further signal processing the orthogonal signal components can be determined.

A method for locating or localizing not only the position and layout of the cable 101, but also the location of a cable fault 423 in the cable 101 is illustrated in FIG. 4 and will now be explained in further detail. An electrical surge generator 425 applies or imposes a current pulse onto the middle voltage cable 101. This current pulse causes the generation of a magnetic field 103 as discussed above. Additionally, the current pulse causes a voltage flash-over or arc at the cable fault location 423 because the cable fault is not able to withstand or conduct the voltage arising from the current pulse. The voltage flash-over or arc produces an acoustic signal 421, which then propagates outwardly through the ground 109. At this time, the cable fault localizing apparatus 105 is used to detect and measure the magnetic field 103 using the coils L1 363 and L2 365 as discussed above for locating and tracing along the cable 101. Additionally, and e.g. simultaneously, the ground-borne sound sensor 107 or microphone of the apparatus 105 detects and measures the acoustic signal 421. The apparatus 105 also includes a timing unit that measures the time delay between detecting the magnetic field signal 103 and detecting the acoustic signal 421. This measurement is known as the coincidence measurement, and the determined time delay is called a coincidence measurement value. The coincidence measurement value indicates the distance between the sound pickup 107 of the apparatus 105 and the cable fault location 423 (dependent on the sound propagation speed through the ground 109, etc.). Thus, the coincidence measurement value will be at a minimum when the cable fault localizing apparatus 105 is positioned directly above the location of the cable fault 423. On the other hand, as the apparatus is moved farther away from the cable fault 423, then the coincidence measurement value will have successively larger numerical values. The apparatus 105 provides to the user an indication of the relative distance to the cable fault location, in addition to the directional indication identifying the location of the cable as discussed above. Namely, for the most effective and efficient procedure for finding and locating the cable fault, the above described procedure for locating and tracing-out the cable and the above described procedure for locating the cable fault, are combined into one method using the single combined apparatus 105 according to the invention.

Figure 6:
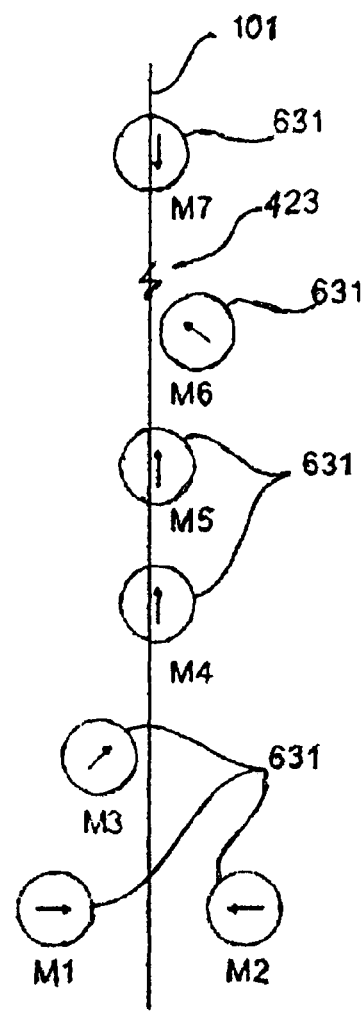
FIG. 6 is a schematic top plan view of successive measuring positions along a cable buried in the ground, according to a localizing process of an embodiment of the invention, also showing directional arrows.

A representative example of a user's path to carry out such a combined measurement procedure, by moving the apparatus 105 to successive measuring positions and taking respective measurements, is illustrated in a schematic top plan view in FIG. 6. The successive steps at the successive measuring positions are summarized in the following table.

| Measuring Position | Result of Phase Evaluation | Result of Comparison of Time Delay Values | Output |
| --- | --- | --- | --- |
| M1 | Sensor located left of cable | No comparison result, because this is first measurement | Arrow display shows target to the right |
| M2 | Sensor located right of cable | New = Old | No change in distance to cable fault, arrow display shows target to the left |
| M3 | Sensor located left of cable | New < Old | Approaching closer to cable fault, arrow display shows target to the right and ahead |
| M4 | Sensor located above cable | New < Old | Approaching closer to cable fault, arrow display shows target straight ahead |
| M5 | Sensor located above cable | New < Old | Approaching closer to cable fault, arrow display shows target straight ahead |
| M6 | Sensor located right of cable | New < Old | Approaching closer to cable fault, arrow display shows target to the left and ahead |
| M7 | Sensor located above cable | New > Old | Moving farther away from cable fault, arrow display shows target to the rear |

Figure 7:
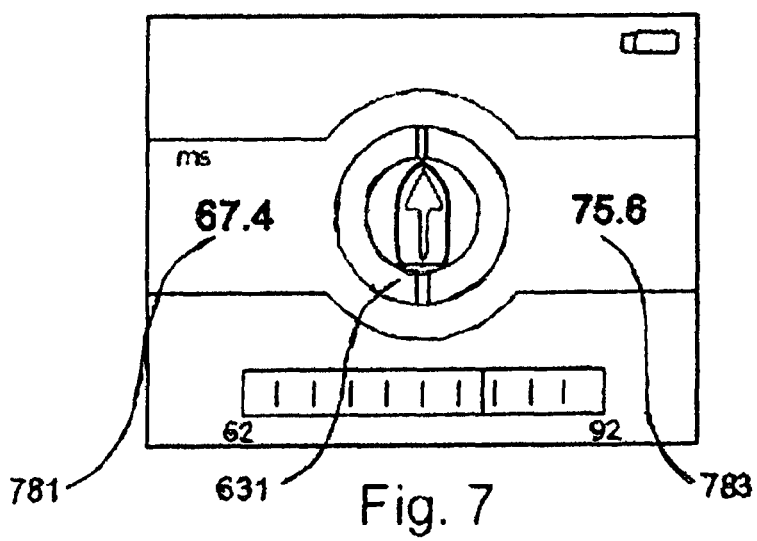
FIG. 7 is a schematic illustration of an example of indications on a display of a cable fault localizing apparatus.

The output of the evaluation is indicated to the user via a display of the apparatus 105 as shown in FIG. 7 for example. This display shows both the coincidence time or time delay (e.g. 67.4 milliseconds) of the coincidence measurement value of the new measuring position at reference number 781, as well as the time delay or coincidence measurement value (e.g. 75.6 milliseconds) of the previous measurement position at reference number 783. Thereby the user can readily see whether he is approaching closer to or moving farther away from the cable fault. Furthermore, the display provides a direction indication 631, which indicates the direction of the cable fault, or the direction of the cable, or a combination of both of these informations. For example as shown in FIG. 7, an arrow displayed within an inner circle of the direction indication 631 points in the general direction of the cable fault, while an outer ring of the direction indication 631 shows a line that represents the orientation of the path of the cable. Generally, the direction indication 631 of FIG. 7 shows the fault direction for example north/south, and/or the cable direction e.g. left/right. Alternatively, the two indications can be combined in a single composite direction arrow. When such two informations are combined, the display arrow may point diagonally, for example as shown in FIG. 6 and discussed above. The display of the apparatus can additionally show further information, such as an estimate of the distance, for example in meters, from the present measuring position to the location of the cable fault.

Figure 5:
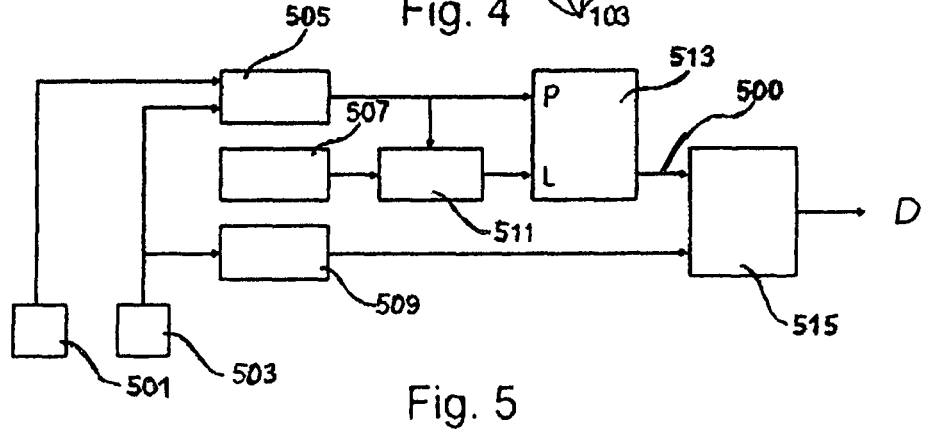
FIG. 5 is a schematic block diagram representing an evaluation procedure and/or an evaluation device for evaluating the direction information.

For further clarification, the method discussed above will now be additionally explained in connection with a block diagram in FIG. 5, which can be understood as representing a functional process flow diagram or a block circuit diagram of components of evaluation circuitry of the apparatus for performing the method. As explained above, to start the procedure a current pulse is applied to the cable 101 by a surge generator. As a result, a magnetic field is generated around the cable and an acoustic signal is emitted from the cable fault. From these signals, the apparatus detects and measures magnetic field informations with electromagnetic coils 503 and acoustic sensor data with an acoustic sensor 501 as explained above. From the magnetic field informations, a signal processor 509 determines the cable direction and/or distance as explained above. A timing unit 505 determines the time delay between the magnetic signal and the acoustic signal as explained above. The time delay value is stored in a memory 511. An optional motion sensor 507 senses when the apparatus is moved from one measuring position to another measuring position, and optionally additionally senses position data. The information from the motion sensor 507 is provided to the memory 511 and triggers successive time delay values to be stored respectively for successive measuring positions of the apparatus. At this new measuring position, once again the cable direction (509) and the time delay value (505) are determined in a new process cycle. The new present time delay value is provided to one input P of a comparator 513, and the last time delay value from the last measuring position (which was stored in the memory 511) is provided to a second input L of the comparator 513. The comparator 513 then compares the two input values to produce a fault direction signal, which is then provided to a data combining or coupling unit 515 (which can be embodied in the display unit described above), which also receives the cable direction information from the signal processing unit 509. Accordingly, the data combining or coupling unit 515 combines the fault direction signal 500 and the cable direction (509) to finally produce a combined direction D, which is indicated to the user of the apparatus, for example via the display as shown in FIG. 7. This direction D identifies the direction in which the user should move in order to approach closer to the cable fault location along the path of the cable.

The fault direction signal or information can be merely a relative indication of moving closer to or farther from the fault location, or may be an indication of a determined or estimated numerical distance value, or may be a relative distance indication on a scale or by a gage pointer, or may include an arrow pointing toward the fault. The cable direction information may be merely an indication of a relative position such as left, right or above, or may include an arrow pointing to the cable, or may additionally include an indication of a relative distance to the cable. Thus a pertinent "position feature" of the cable or the cable fault to be determined and indicated can comprise any of the above types of information. The output device may comprise any type of graphic display, a display screen, a printer that produces a printout, an audio output including a loudspeaker that produces an audio tone or spoken information, an analog or digital gage or indicator, or any other known output device. A particular embodiment of an output device is represented by the display unit shown and described in connection with FIG. 7.

The inventive apparatus and method may expressly exclude the inclusion or use of an audio frequency transmitter.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims. The abstract of the disclosure does not define or limit the claimed invention, but rather merely abstracts certain features disclosed in the application.

What is claimed is:

1. A method of evaluating at least one feature of a buried electrical cable that has a cable fault at a cable fault location, comprising the steps:
    a) positioning an evaluation apparatus at a first measuring position, wherein said evaluation apparatus includes at least one electromagnetic coil, an acoustic sensor and an output device;
    b) applying a first electrical pulse to said electrical cable, which produces a first magnetic field around said electrical cable and produces a first acoustic signal emitted from said cable fault;
    c) while said evaluation apparatus is positioned at said first measuring position, detecting said first magnetic field with said at least one electromagnetic coil to produce a first magnetic field information, and detecting said first acoustic signal with said acoustic sensor, and;
    d) from at least said first magnetic field information, determining a cable position information indicative of a cable position feature of said electrical cable relative to said evaluation apparatus;
    e) via said output device, outputting said cable position information to indicate said cable position feature of said electrical cable relative to said evaluation apparatus;
    f) determining a first time delay between said detecting of said first magnetic field and said detecting of said first acoustic signal;
    g) positioning said evaluation apparatus at a second measuring position different from said first measuring position;
    h) applying a second electrical pulse to said electrical cable, which produces a second magnetic field around said electrical cable and produces a second acoustic signal emitted from said cable fault;
    i) while said evaluation apparatus is positioned at said second measuring position, detecting said second magnetic field with said at least one electromagnetic coil to produce a second magnetic field information, and detecting said second acoustic signal with said acoustic sensor;
    j) determining a second time delay between said detecting of said second magnetic field and said detecting of said second acoustic signal;
    k) comparing said first time delay with said second time delay, and from a result of said comparing determining a fault position information indicative of a fault position feature of said cable fault relative to said evaluation apparatus; and
    l) via said output device, outputting said fault position information to indicate said fault position feature of said cable fault relative to said evaluation apparatus.

2. The method according to claim 1, wherein said at least one electromagnetic coil includes first and second electromagnetic coils that are arranged with respective coil axes thereof diverging from one another, wherein said first magnetic field information includes a first coil signal produced by said first electromagnetic coil and a second coil signal produced by said second electromagnetic coil, and said determining in said step d) comprises evaluating at least one of: a relative phase position of said first coil signal and said second coil signal relative to one another, and/or a signal strength of at least one of said coil signals.

3. The method according to claim 2, wherein said determining in said step d) comprises evaluating said signal strength.

4. The method according to claim 2, wherein said determining in said step d) comprises evaluating said relative phase position.

5. The method according to claim 2, wherein said determining in said step d) comprises evaluating both said signal strength and said relative phase position.

6. The method according to claim 2, wherein said cable position feature comprises a relative position of said electrical cable relative to said evaluation apparatus, and wherein said step d) comprises determining said cable position information indicative of said relative position as an indication of what direction said electrical cable is located relative to said evaluation apparatus.

7. The method according to claim 1, further comprising successively moving said evaluation apparatus to plural successive distinct measuring positions different from said first measuring position, and repeating said steps b), c), d) and e) at each one of said measuring positions, and thereby tracing out a layout of said electrical cable according to said cable position feature determined respectively at each one of said measuring positions.

8. The method according to claim 7, wherein said evaluation apparatus further includes a motion sensor, and wherein said method further comprises sensing, with said motion sensor, said moving of said evaluation apparatus.

9. The method according to claim 1, further comprising levelling said evaluation apparatus at said first measuring position before performing said step c).

10. The method according to claim 1, wherein said fault position feature of said cable fault comprises a relative proximity of said cable fault to said evaluation apparatus at said second measuring position compared to said first measuring position.

11. The method according to claim 1, wherein said fault position feature of said cable fault comprises a relative position of said cable fault relative to said evaluation apparatus as an indication of what direction said cable fault is located relative to said evaluation apparatus.

12. The method according to claim 1, further comprising combining said cable position information and said fault position information into a combined direction information indicative of a direction from said evaluation apparatus to said cable fault along said electrical cable, and wherein said outputting of said cable position information and said outputting of said fault position information together comprise outputting said combined direction information.

13. The method according to claim 1, further comprising repeating all of said steps respectively at each one of successive further measuring locations and thereby homing-in on said cable fault in said electrical cable.

14. An apparatus for locating a cable fault in a buried electrical cable, comprising
- an acoustic sensor configured and adapted to sense an acoustic signal emitted from the cable fault;
- first and second electromagnetic coils that are arranged with respective coil axes thereof oriented orthogonally relative to one another, and that are configured and adapted to detect an electromagnetic field produced around said electrical cable;
- a signal processing unit that is connected to outputs of said electromagnetic coils, and that is configured and adapted to determine a relative direction of said electrical cable from signals output by said electromagnetic coils;
- a timing unit that is connected to said outputs of said electromagnetic coils and to an output of said acoustic sensor, and that is configured and adapted to determine a time delay between said signals output by said electromagnetic coils and a signal output by said acoustic sensor;
- a memory connected to an output of said timing unit;
- a comparator connected to said output of said timing unit and an output of said memory, wherein said comparator is configured and adapted to determine a relative distance or direction of said cable fault from successive values of said time delay; and
- a display that is connected to an output of said comparator and an output of said signal processing unit, and that is configured and adapted to display, individually or combined, said relative direction of said electrical cable and said relative distance or direction of said cable fault.

15. The apparatus according to claim 14, further comprising a motion sensor having an output connected to an input of said memory.

16. The apparatus according to claim 14, further comprising a levelling device for levelling said apparatus.

17. The apparatus according to claim, 14, wherein said comparator is configured and adapted to determine, and said display is configured and adapted to display, said relative direction of said cable fault from said successive values of said time delay.

18. The apparatus according to claim 14, wherein said comparator is configured and adapted to determine, and said display is configured and adapted to display, said relative distance and said relative direction of said cable fault from said successive values of said time delay.

19. A method of evaluating at least one feature of a buried electrical cable, comprising the steps:
a) positioning an evaluation apparatus at a first measuring position, wherein said evaluation apparatus includes at least one electromagnetic coil and an output device;
b) applying a first electrical pulse to said electrical cable, which produces a first magnetic field around said electrical cable;
c) while said evaluation apparatus is positioned at said first measuring position, detecting said first magnetic field with said at least one electromagnetic coil to produce a first magnetic field information;
d) from at least said first magnetic field information, determining a cable position information indicative of a position feature of said electrical cable relative to said evaluation apparatus;
e) via said output device, outputting said cable position information to indicate said position feature of said electrical cable relative to said evaluation apparatus;
f) positioning said evaluation apparatus at a second measuring position different from said first measuring position;
g) applying a second electrical pulse to said electrical cable, which produces a second magnetic field around said electrical cable; and
h) while said evaluation apparatus is positioned at said second measuring position, detecting said second magnetic field with said at least one electromagnetic coil to produce a second magnetic field information;

wherein said position feature comprises a relative proximity of said electrical cable to said evaluation apparatus, and wherein said step d) comprises evaluating said first magnetic field information and said second magnetic field information relative to one another to determine said cable position information indicative of said relative proximity as an indication whether said second measuring position in comparison to said first measuring position is closer to or farther from said electrical cable.

* * * * *